(12) United States Patent
Kandori et al.

(10) Patent No.: US 11,283,406 B2
(45) Date of Patent: Mar. 22, 2022

(54) OSCILLATOR, ILLUMINATION DEVICE, AND IMAGING DEVICE

(71) Applicant: CANON KABUSHIKI KAISHA, Tokyo (JP)

(72) Inventors: Atsushi Kandori, Ebina (JP); Noriyuki Kaifu, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/001,828

(22) Filed: Aug. 25, 2020

(65) Prior Publication Data
US 2021/0067095 A1    Mar. 4, 2021

(30) Foreign Application Priority Data
Aug. 26, 2019    (JP) .............................. JP2019-153639

(51) Int. Cl.
*H03B 7/08*        (2006.01)
*H03B 7/14*        (2006.01)

(52) U.S. Cl.
CPC ............... *H03B 7/08* (2013.01); *H03B 7/143* (2013.01)

(58) Field of Classification Search
CPC ........................................................ H03B 7/08
USPC ...................................................... 331/107 T
See application file for complete search history.

(56) References Cited

U.S. PATENT DOCUMENTS

| 8,176,780 B2 | 5/2012 | Takagi et al. ............... 73/504.14 |
| 8,339,014 B2 | 12/2012 | Kandori et al. ............... 310/309 |
| 8,393,211 B2 | 3/2013 | Kandori et al. ............ 73/504.12 |
| 9,258,650 B2 | 2/2016 | Kandori ............... B81B 3/0021 |
| 2012/0001698 A1 | 1/2012 | Koyama et al. |
| 2012/0119838 A1* | 5/2012 | Koyama ................... H03B 7/08 331/115 |
| 2015/0365611 A1* | 12/2015 | Sekiguchi ............... G01S 17/89 250/208.1 |
| 2020/0266762 A1 | 8/2020 | Kandori et al. .......... H03B 7/08 |

FOREIGN PATENT DOCUMENTS

| JP | H07-87731 A | 3/1995 |
| JP | 2007-174087 A | 7/2007 |
| JP | 5717336 B2 | 5/2015 |

OTHER PUBLICATIONS

U.S. Appl. No. 17/001,821, filed Aug. 25, 2020.

* cited by examiner

*Primary Examiner* — Joseph Chang
(74) *Attorney, Agent, or Firm* — Venable LLP

(57) ABSTRACT

An oscillator disclosed herein includes an oscillation circuit including a negative resistance element, a voltage bias circuit applying voltage to the oscillation circuit. The oscillator further includes a switch provided in a path, in which the voltage bias circuit and the oscillation circuit are electrically coupled to each other, and implementing switching between a conductive state and a non-conductive state of the path, and a constant voltage element electrically coupled in parallel to the switch.

15 Claims, 13 Drawing Sheets

OSCILLATOR, ILLUMINATION DEVICE, AND IMAGING DEVICE

BACKGROUND OF THE INVENTION

Field of the Invention

The present invention relates to an oscillator, an illumination device, and an imaging device.

Description of the Related Art

As a compact oscillator for generating terahertz waves as electromagnetic waves in a frequency band of 30 GHz or more and 30 THz or less, an oscillation circuit (resonator) including a negative resistance element, such as a resonant tunneling diode (RTD), is used in some cases.

In the oscillation circuit, a configuration is known in which a voltage bias circuit is coupled such that a voltage, at which characteristics of a negative resistor of the negative resistance element are exhibited, is applied to the negative resistance element to perform terahertz oscillation (see Japanese Patent No. 5717336).

When an oscillator is used as illumination, a configuration may be employed in which an AC voltage at a frequency lower than an oscillation frequency of terahertz waves is applied from the voltage bias circuit. This configuration makes it possible to obtain high-quality image information on a subject from a difference between image information when illumination is implemented and image information when illumination is not implemented.

However, when the voltage applied to the oscillation circuit having the negative resistance element is changed, a current flowing through the oscillation circuit may change, and as a result of this, a bias voltage applied to the negative resistance element may fluctuate. When the current flowing through the oscillation circuit changes, the bias voltage applied to the negative resistance element deviates from a desired voltage, and terahertz oscillation cannot be performed.

The technology disclosed herein has been made in view of the above, and it is an object thereof to provide a technology for stably performing oscillation in an oscillator including a negative resistance element and an oscillation circuit.

SUMMARY OF THE INVENTION

It is provided an oscillator, including an oscillation circuit including a negative resistance element, a voltage bias circuit applying voltage to the oscillation circuit, a switch provided in a path, in which the voltage bias circuit and the oscillation circuit are electrically coupled to each other, and implementing switching between a conductive state and a non-conductive state of the path, and a constant voltage element electrically coupled in parallel to the switch.

Further features of the present invention will become apparent from the following description of exemplary embodiments with reference to the attached drawings.

DESCRIPTION OF THE EMBODIMENTS

Figure 1:
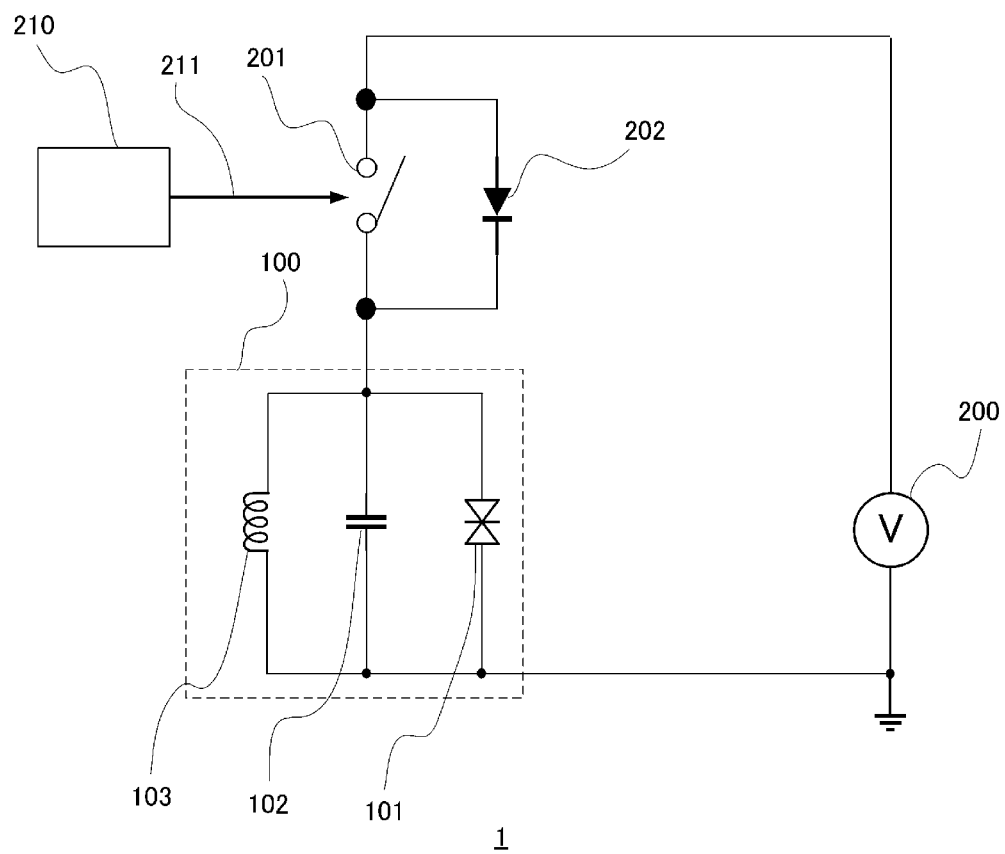
FIG. 1 is a schematic diagram for describing an oscillator according to a first embodiment.

Referring to the drawings, exemplary embodiments of the technology disclosed herein are described below. The dimensions, materials, shapes, and relative arrangement of components described below should be changed as appropriate depending on configurations and various conditions to which the invention is applied. Thus, the scope of the present invention is not intended to be limited to the following description. In particular, well-known technologies or publicly known technologies in the technical field can be applied to configurations and steps that are not illustrated and described. Overlapping descriptions are sometimes omitted.

First Embodiment

An oscillator according to the present embodiment has a switch and a constant voltage element disposed in parallel. For a voltage bias circuit, the switch and the constant voltage element are disposed in series to a terahertz oscillation circuit.

Circuit Configuration of Oscillator

FIG. 1 illustrates a schematic configuration of an oscillator 1 in the present embodiment. In FIG. 1, the oscillator 1 has an oscillation circuit 100, a voltage bias circuit 200, a switch 201, a constant voltage element 202, and a control signal generation unit 210. The oscillation circuit 100 has a negative resistance element 101, a capacitor 102, and an inductor 103. The oscillator 1 in the present embodiment has the switch 201 and the constant voltage element 202 coupled in parallel in a path in which a voltage is applied from the voltage bias circuit 200 to the oscillation circuit 100.

The oscillation circuit 100 is a resonator (terahertz oscillation circuit) configured by the negative resistance element 101 and a pair of the capacitor 102 and the inductor 103 coupled in parallel. When a predetermined voltage is applied from the voltage bias circuit 200 to the negative resistance element 101, the oscillation circuit 100 oscillates electromagnetic waves at a predetermined frequency in a range of 30 GHz or more and 30 THz or less (terahertz waves; predetermined electromagnetic waves). The predetermined electromagnetic waves are electromagnetic waves generated by oscillation (resonance) of the oscillation circuit 100 whose frequency is mainly determined by design parameters of the oscillation circuit 100. Note that, in the following description, the oscillation of the oscillation circuit 100 for generating terahertz waves is referred to as "terahertz oscillation".

For the negative resistance element 101, a voltage-controlled negative resistor can be used. Specifically, a current injection resonant tunneling diode (RTD) can be used to form an oscillation circuit at a predetermined frequency (terahertz frequency). The resonant tunneling diode (RTD) is formed from quantum wells of GaAs and InGaAs/InAlAs.

Figure 2A:
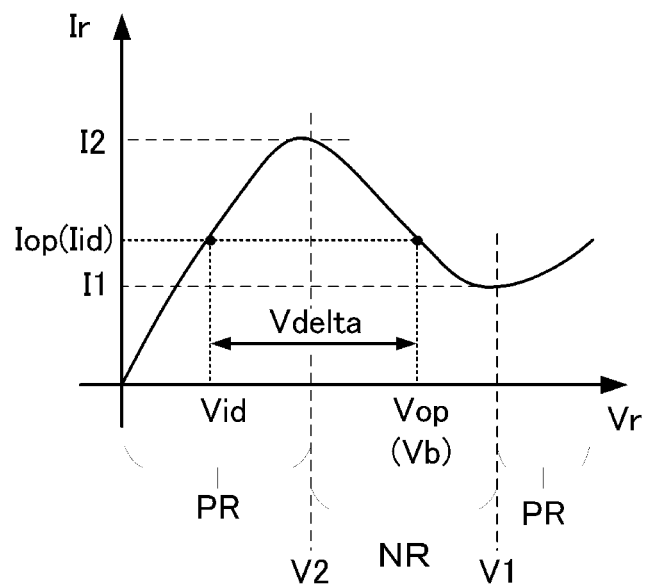
FIGS. 2A and 2B are schematic diagrams for describing characteristics of an element according to the first embodiment.

FIG. 2A illustrates voltage-current characteristics of a voltage applied between both terminals (anode and cathode) of the negative resistance element 101 and a current flowing through the negative resistance element 101. In the graph in FIG. 2A, the horizontal axis is a voltage Vr applied to the negative resistance element 101, and the vertical axis is a current Ir flowing through the negative resistance element 101. The voltage-current characteristics can be divided into two regions, a region PR in which the current increases as the voltage increases and a region NR in which the current decreases as the voltage increases. The region NR in which the current decreases as the voltage increases is a region indicating characteristics of a negative resistor. In the following description, the region NR is referred to as "negative resistance region" and the region PR is referred to as "resistance region".

When a voltage (operation voltage Vop) in the negative resistance region NR is applied between both terminals of the negative resistance element 101, electromagnetic waves at a terahertz frequency ft (terahertz waves) are generated due to oscillation by the negative resistance element 101, the capacitor 102, and the inductor 103. When the operation voltage changes, oscillation conditions (such as frequency and magnitude of output) change. Thus, it is important to set the operation voltage to be a constant voltage. Note that it is desired that the operation voltage Vop be set to a value near the center of the voltage range in the negative resistance region NR in order to enhance the stability of oscillation. The operation voltage Vop is not limited thereto, and another voltage may be set as long as stable oscillation can be performed in the negative resistance region NR. As illustrated in FIG. 2A, in the negative resistance element 101, a current I1 flowing when a voltage V1 of the upper limit of the negative resistance region NR is applied is smaller than a current I2 flowing when a voltage V2 of the lower limit of the negative resistance region NR is applied.

A current flowing through the negative resistance element 101 when the operation voltage Vop is applied is represented by Iop. Note that the specific voltage value of the operation voltage changes depending on parameters of the negative resistance element 101, and is in a range of about 0.5 to 1.5 V in general in many cases. On the other hand, the specific current value of the current flowing through the negative resistance element 101 changes depending on parameters of the RTD, and is in a range of about 20 to 150 mA in general. The voltage Vop and the current Iop can be applied even in ranges other than the voltage range and the current range described above, and the same effects can be obtained.

Figure 3A:
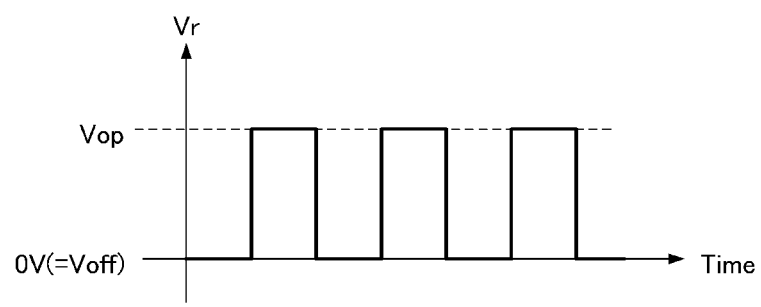
FIGS. 3A and 3B are schematic diagrams for describing operation of the oscillator according to the first embodiment.
Figure 3B:
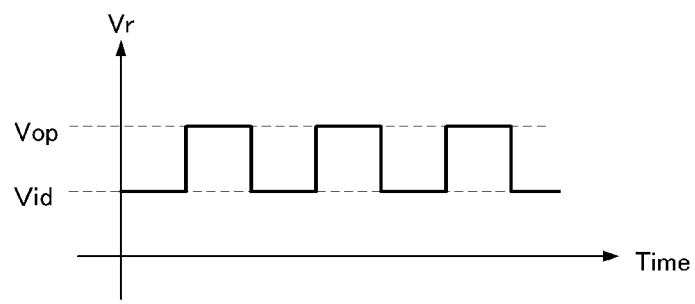

Terahertz oscillation can be stopped by setting the voltage applied between both terminals of the negative resistance element 101 to a voltage in the resistance region PR. FIG. 3A illustrates a voltage setting example. By changing the voltage applied between both terminals of the negative resistance element 101 alternatingly between a voltage in the negative resistance region NR and a voltage (in FIG. 3A, 0 V (=Voff)) in the resistance region PR, the terahertz oscillation and the stop of the oscillation can be repeated. In this manner, in the present embodiment, the voltage applied to the oscillation circuit when the path is brought into the conductive state by the switch 201 falls within the negative resistance region NR. The voltage applied to the oscillation circuit when the path is brought into the non-conductive state by the switch 201 falls within the resistance region PR outside the negative resistance region NR.

Note that the frequency used to repeat the terahertz oscillation and the stop of the oscillation is a frequency sufficiently lower than a frequency used to continue the terahertz oscillation, and is typically a frequency in a range of several Hz to several tens of MHz. In this manner, when the terahertz oscillation is stopped, offset noise components of terahertz waves applied by other elements can be grasped. Thus, in a camera designed such that a subject is irradiated with terahertz waves as illumination and terahertz waves reflected from the subject are imaged, noise components other than those derived from illumination can be removed to implement a terahertz camera with a high S/N ratio. In general, however, when the voltage applied between both terminals of the negative resistance element 101 changes, the current flowing therethrough also changes. Thus, in the case of changing the flowing current from a small current to a large current, when the voltage is changed together, it may take time until the voltage reaches the voltage Vop or take time until the voltage is stabilized.

As illustrated in FIG. 2A, in the voltage-current characteristics of the negative resistance element 101, a voltage Vid with which substantially the same current as the current Iop flowing when the operation voltage Vop is applied is present separately from the operation voltage. In the present embodiment, the voltage Vid is used in order to solve the above-mentioned problem. Specifically, the oscillator 1 is configured such that the voltage Vop and the voltage Vid are alternatingly applied to the negative resistance element 101 in the oscillation circuit 100. In this manner, the constant voltage element 202 coupled in parallel to the switch 201 has an important role in setting the currents flowing through the oscillation circuit 100 during oscillation and during non-oscillation to the constant current Iop.

Next, the details of the operation of the oscillator 1 in the present embodiment are described. In the oscillator in the present embodiment, as illustrated in FIG. 1, a voltage is applied from the voltage bias circuit 200 to the oscillation circuit 100 having the negative resistance element 101 through the switch 201. A control signal 211 is output from the control signal generation unit 210 to the switch 201, and both terminals of the switch 201 are periodically brought into conductive and non-conductive state (decoupled). In the present embodiment, the constant voltage element 202 is coupled in parallel to the switch 201.

Figure 2B:
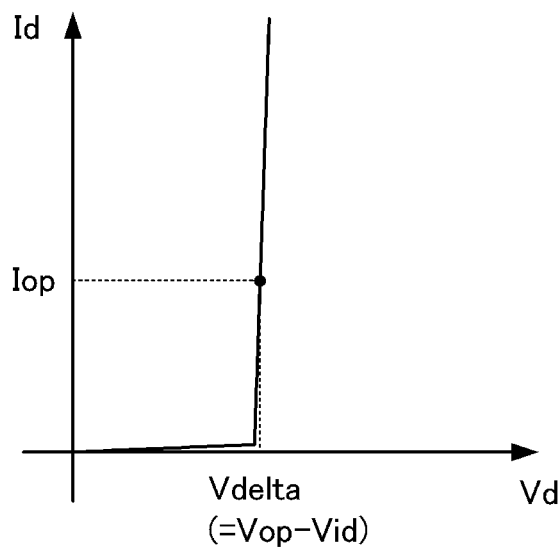

FIG. 2B illustrates voltage-current characteristics of the constant voltage element 202. In the graph in FIG. 2B, the horizontal axis is a voltage Vd applied in an anode-cathode direction of the constant voltage element 202, and the vertical axis is a current Id flowing in the anode-cathode direction of the constant voltage element 202. The constant voltage element 202 is ideally an element for generating a predetermined voltage Vdelta when a current flows (when current Id exceeds 0 A). It is desired that the generated voltage does not fluctuate due to fluctuation in the flowing current Id, but when the current Id changes, the generated voltage slightly changes. The change amount (about several mV to 100 mV) of the voltage is sufficiently smaller than a bias voltage Vb and the operation voltage Vop (0.5 V to 1.5 V), and hence the constant voltage element 202 can be used in the oscillator 1 in the present embodiment without any practical problem.

The constant voltage element 202 can be implemented by using a diode. The diode used for the constant voltage element 202 is disposed such that an anode terminal and a cathode terminal are disposed in this order in a direction in which a current flows into the oscillation circuit 100. In the constant voltage element 202, almost no current Id flows in a region in which the voltage Vd is small, and the current value of the current Id can be regarded to be 0 (Id≈0) with respect to the current Iop flowing from the voltage bias circuit 200. As the voltage Vd becomes larger, the current Id exponentially increases. The voltage Vd with which the current Id starts to greatly increase is referred to as "threshold voltage". The threshold voltage is 0.7 V to 0.9 V in general. In the present embodiment, the voltage Vd and the current Id of the constant voltage element 202 change depending on the conductive state and the non-conductive state of the switch 201 coupled in parallel to the constant voltage element 202, and hence the current flowing from the voltage bias circuit 200 becomes substantially constant. In the following description, the constant voltage element 202 is described as the diode 202, but is not limited to the diode, and a member for obtaining the same characteristics may be used for the constant voltage element 202.

Figure 4A:
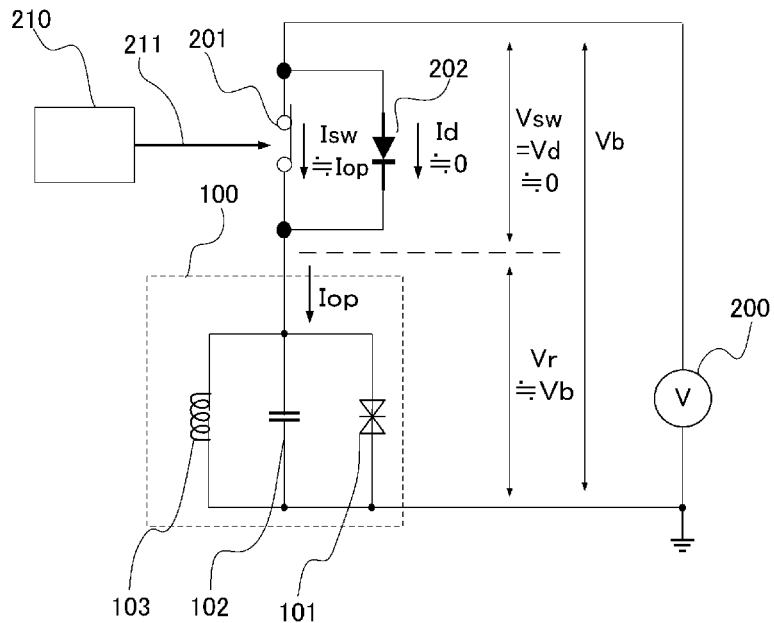
FIGS. 4A and 4B are schematic diagrams for describing a voltage change in the oscillator according to the first embodiment.

FIG. 4A illustrates the oscillator 1 in which the switch 201 is in the conductive state. In this state, the path in which a current flows in the oscillator 1 is the switch 201 and the oscillation circuit 100, and a voltage applied to the oscillation circuit 100 is determined by the voltage Vb output from the voltage bias circuit 200.

When the switch 201 is conductive (ON state), a voltage Vsw between both terminals of the switch 201 can be regarded as substantially 0 (Vsw≈0). Thus, the voltage Vd applied between both terminals of the diode 202 disposed in parallel to the switch 201 is similarly substantially 0 (Vd≈0). The typical value of the voltage Vd is several mV to several hundreds of mV. Thus, the voltage Vr applied to the oscillation circuit 100 is substantially the same as the voltage Vb output from the voltage bias circuit 200 (=Vb−Vsw=Vb−Vd≈Vb−0). The voltage Vr is set such that the voltage Vop necessary for the oscillation circuit 100 to perform terahertz oscillation is applied to the oscillation circuit 100 (Vr≈Vb≈Vop). In a strict sense, even when the switch 201 is conductive, a minute voltage V0 is generated in the switch 201. Thus, it is more preferred that the voltage Vb output from the voltage bias circuit be determined such that the optimum voltage Vop is applied to the oscillation circuit 100 in consideration of the minute voltage V0 (Vb=Vop+V0=Vr+V0). The typical value of the voltage V0 is several mV to several hundreds of mV.

In the oscillation circuit 100, the current Iop corresponding to the applied voltage Vop necessary for terahertz oscillation flows. As illustrated in FIG. 2A, the current Iop is determined by the characteristics of the negative resistance element 101 in the oscillation circuit 100 and the terminal-to-terminal voltage Vr (=Vop).

In the diode 202, when the voltage Vd applied to the oscillation circuit 100 is near 0 V, the flowing current Id can be regarded as almost 0 (Id≈0). Thus, when the switch 201 is in the conductive state, it can be said that the current Id does not flow through the diode 202. In a strict sense, a minute current I0 flows through the diode 202, but the current does not affect the voltage Vr applied to the oscillation circuit 100 and the current Iop flowing into the oscillation circuit 100. The typical value of the current Id is several nA to several tens of mA. Thus, the current flowing from the voltage bias circuit 200 can be regarded as the current Iop flowing through the oscillation circuit 100.

Figure 4B:
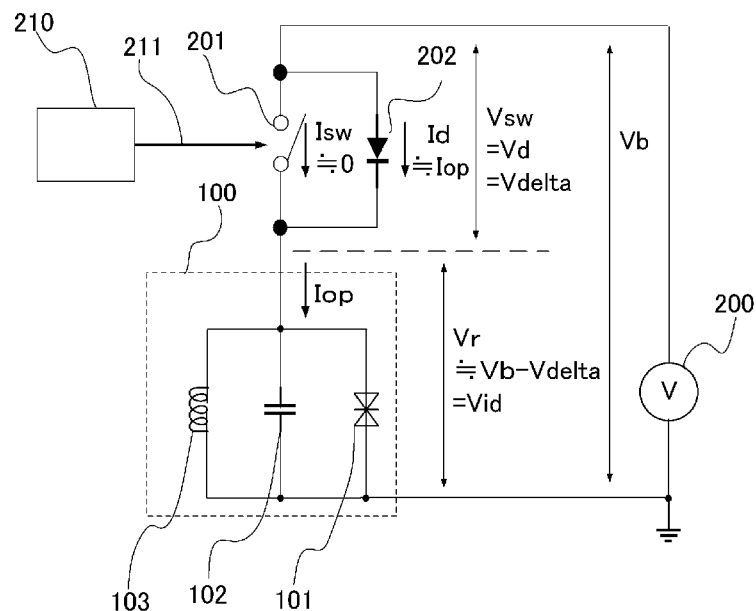

FIG. 4B schematically illustrates the oscillator 1 in which the switch 201 is in the non-conductive state. In this state, the path in which a current flows is a path from the diode 202 to the oscillation circuit 100. A voltage applied to the oscillation circuit 100 is determined by the relation of the characteristics of the negative resistance element 101 in the oscillation circuit 100 and the characteristics of the diode 202.

When the switch 201 is in the non-conductive state, it can be considered that almost no current flows through the switch 201 (Isw≈0). The current from the voltage bias circuit 200 flows to the diode 202 coupled in parallel to the switch 201. The diode 202 has the voltage-current characteristics illustrated in FIG. 2B. Thus, after the current Iop flows through the diode 202, the corresponding voltage Vdelta (=Vd) is generated between the terminals of the diode 202. Note that the voltage Vdelta (=Vsw) is similarly applied to the switch 201, but the non-conductive state of the switch 201 is maintained.

On the other hand, the voltage Vr applied to the oscillation circuit 100 is a voltage Vr (=Vb−Vdelta) obtained by subtracting the voltage drop Vdelta in the diode 202 from the output voltage Vb of the power supply bias circuit 200. As illustrated in FIG. 2A, the voltage Vr applied to the oscillation circuit 100 is set to be a voltage Vid outside the range of the negative resistance region (Vid=Vb−Vdelta). Thus, terahertz oscillation in the oscillation circuit 100 is stopped. The voltage Vid is a voltage with which the current flowing through the oscillation circuit becomes Iop. In the present embodiment, the parameters of the diode 202 are set such that the voltage Vr applied to the oscillation circuit 100 when the switch 201 is in the non-conductive state becomes substantially the same value as the voltage Vid (Vr≈Vid).

Thus, the current flowing through the diode 202 when the switch 201 is in the non-conductive state is Iop, and the current flowing through the oscillation circuit 100 coupled in series to the diode 202 is also Iop. Accordingly, the current output from the voltage bias circuit 200 when the switch 201 is in the non-conductive state is also Iop. In this manner, the currents output from the voltage bias circuit 200 when the switch 201 is in the non-conductive state and when the switch 201 is in the conductive state can be set to be the same Iop. Note that, in the above description, the voltage Vb is an example of first voltage applied to the negative resistance element when the oscillation circuit 100 oscillates. The voltage Vid is an example of second voltage applied to the negative resistance element when the oscillation circuit 100 stops oscillation. The current Iop flowing through the oscillation circuit 100 when the oscillation circuit 100 oscillates is an example of first current, and the current Iop flowing through the oscillation circuit 100 when the oscillation circuit 100 stops oscillation is an example of second current. The current Iop flowing through the diode 202 when the oscillation circuit 100 stops oscillation is an example of third current, and the voltage Vdelta applied to the diode 202 in this case is an example of third voltage.

As described above, according to the present embodiment, the currents flowing from the voltage bias circuit 200 when the path coupling the voltage bias circuit and the oscillation circuit is brought into the conductive state and the non-conductive state by the switch 201 can be set substantially the same. Thus, even when the switch 201 becomes repeatedly conductive and non-conductive, the voltage Vb can be stably output from the voltage bias circuit 200. Accordingly, in the present embodiment, the voltage applied to the oscillation circuit 100 can be stabilized, and hence the terahertz oscillation and the stop of the oscillation can be stably performed. Consequently, the oscillator 1 in the present embodiment can be used as terahertz illumination that stably operates. The fluctuation in operation voltage necessary for terahertz oscillation can be suppressed without greatly changing the current from the voltage bias circuit. In the oscillation circuit, terahertz oscillation at a stable operation point can be performed.

Note that, in the above description, the current flowing from the voltage bias circuit 200 is substantially the same as the operation current Iop. In the present embodiment, it is desired that the fluctuation in current flowing from the voltage bias circuit 200 to the switch 201 between the conductive state and the non-conductive state of the switch 201 be suppressed in a range of ±20% of the operation current Iop. In this manner, the fluctuation in output voltage Vb from the voltage bias circuit can be reduced. It is desired that the fluctuation range of the current flowing from the voltage bias circuit 200 be used with reference to the above-mentioned range, but the fluctuation range changes depending on the actual voltage and current and various parameters used in the oscillation circuit. A range wider than the above-mentioned range may be employed as long as no practical problem occurs.

Second Embodiment

Figure 5A:
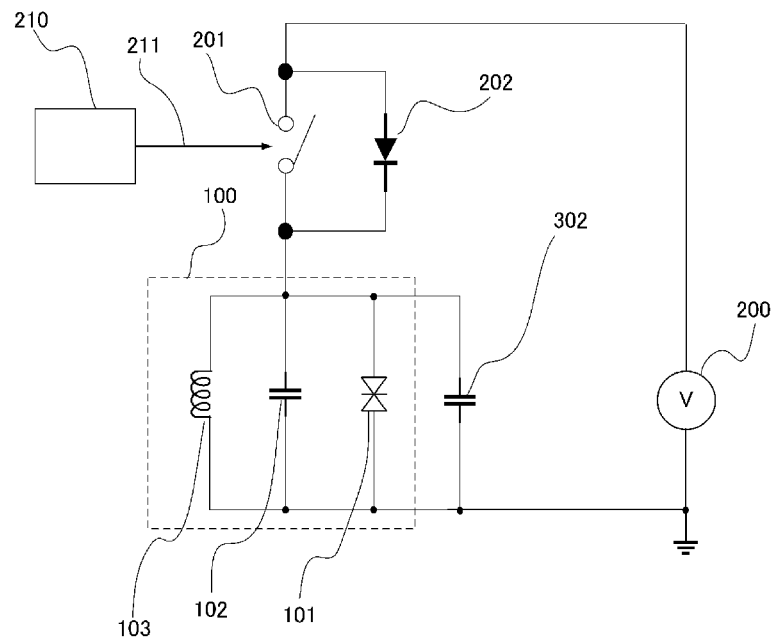
FIGS. 5A and 5B are schematic diagrams of oscillators according to a second embodiment.
Figure 5B:
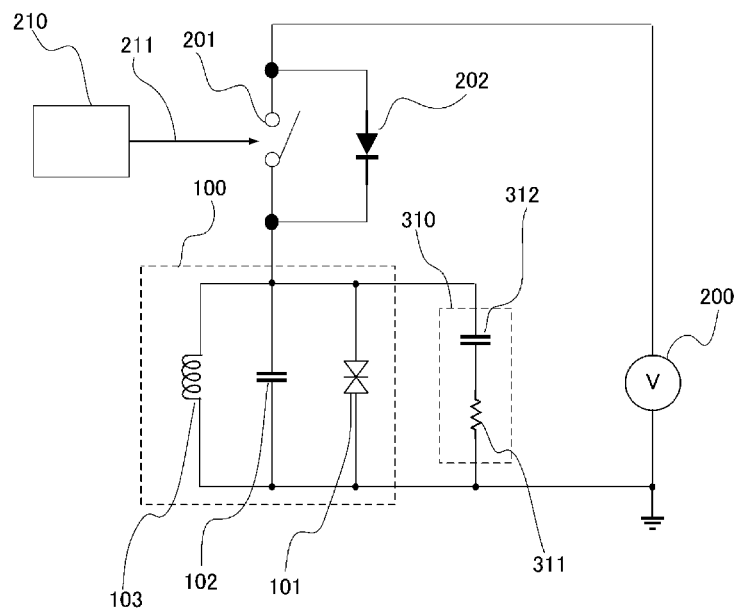

Next, an oscillator in a second embodiment is described. Note that, in the following description, the same components as in the first embodiment are denoted by the same reference symbols, and detailed descriptions thereof are omitted. The purpose of the oscillator in the present embodiment is to perform terahertz oscillation more stably. FIG. 5A illustrates a schematic configuration of an oscillator 2 according to the present embodiment. FIG. 5B illustrates a schematic configuration of another oscillator 20 according to the present embodiment. The oscillator 2 has a capacitor shunt element 302. The oscillator 20 includes a resistor capacitor shunt element 310. The resistor capacitor shunt element 310 has a capacitor 311 and a resistor 312.

In the oscillators 2 and 20, terahertz waves at a frequency ft are oscillated by the oscillation circuit 100 having the negative resistance element 101, the capacitor 102, and the inductor 103. A switch 201 and a diode 202 are coupled to the oscillation circuit 100. Thus, another oscillation circuit may be provided between the negative resistance element 101 in the oscillation circuit 100 and the switch 201 or the diode 202 due to parasitic elements (resistance, capacitance, and inductance) of the switch 201 and the diode 202. In this case, oscillation occurs at frequencies other than the above-mentioned frequency ft of terahertz waves. Such oscillation is referred to as "parasitic oscillation". When parasitic oscillation occurs, desired terahertz oscillation cannot be performed in the oscillators 2 and 20 in some cases. The parasitic oscillation may occur not only between the oscillation circuit 100 and the parasitic element such as the switch 201 and the diode 202 but also between the oscillation circuit 100 and a parasitic element in the voltage bias circuit 200 or a wiring part.

In the present embodiment, a shunt element is coupled in parallel to the oscillation circuit 100 in order to suppress parasitic oscillation. In the oscillator 2 in FIG. 5A, a capacitor shunt element 302, which is a capacitor-type shunt element, is provided. The impedance of the capacitor shunt element 302 is equal to or smaller than the impedance of the negative resistance element 101 in the oscillation circuit 100 in a frequency region for which parasitic oscillation needs to be suppressed. In this manner, the oscillation circuit 100 can be prevented from being coupled to an external parasitic element to perform parasitic oscillation at a frequency other than the predetermined terahertz frequency ft.

In the oscillator 20 illustrated in FIG. 5B, a resistor capacitor shunt element 310, which is a resistor capacitor-type shunt element, is provided instead of the capacitor shunt element 302. The resistor capacitor shunt element 310 is a shunt element in which a resistor element 311 and a capacitor element 312 are coupled in series. The resistor capacitor shunt element 310 has a larger number of components than that of the capacitor shunt element, but can suppress parasitic oscillation in a wider frequency range. Specifically, the resistor element 311 and the capacitor element 312 are coupled in series, and hence a steady current does not flow in a DC frequency region. In a frequency region sufficiently higher than a frequency determined by the time constant of the resistor element 311 and the capacitor element 312, the capacitor element 312 becomes short-circuited, and loss can be generated in the resistor element 311. Thus, the resistor capacitor shunt element 310 can avoid the oscillation circuit 100 from being coupled to an external parasitic element. Due to the presence of the capacitor element 312, the same characteristics as the voltage-current characteristics illustrated in FIG. 2A can be obtained when the oscillation circuit 100 and the resistor capacitor shunt element 310 are seen together from the outside.

Figure 12:
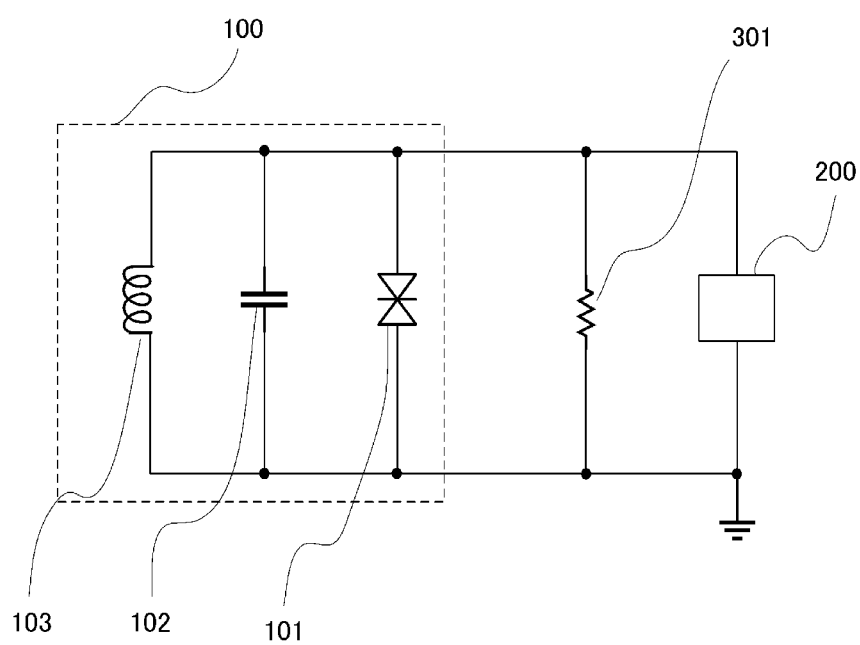
FIG. 12 is a schematic diagram for describing a conventional oscillator.
Figure 13:
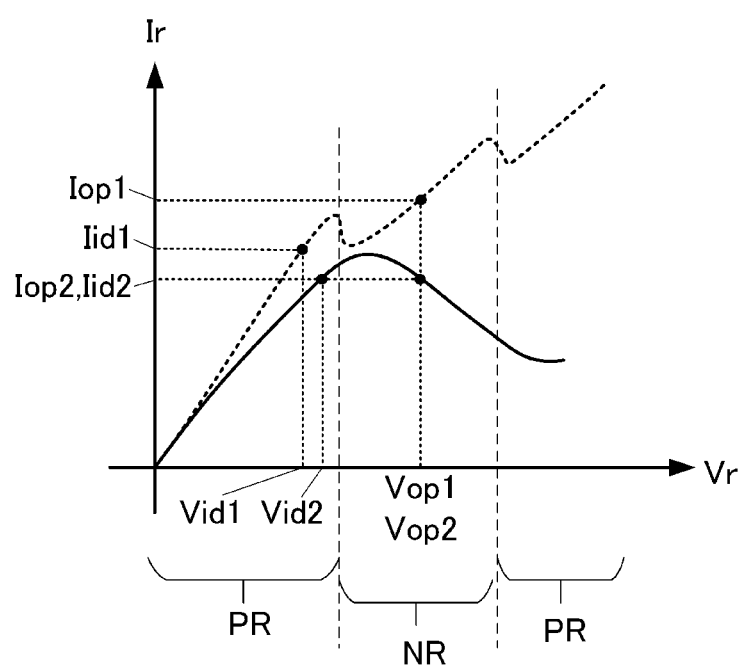
FIG. 13 is a diagram illustrating voltage-current characteristics for describing the oscillator according to the first embodiment.

As described above, in the present embodiment, the capacitor shunt element 302 or the resistor capacitor shunt element 310 is used as a shunt element. In the present embodiment, even when the resistor shunt element 301 is used as a shunt element, the same characteristics as the voltage-current characteristics illustrated in FIG. 2A cannot be obtained. FIG. 13 is a graph exemplifying voltage-current characteristics when the oscillation circuit 100 and various shunt elements are regarded as one element. In FIG. 13, voltage-current characteristics when the oscillation circuit 100 and the capacitor shunt element 302 or the resistor capacitor shunt element 310 in the present embodiment are regarded as one element are indicated by the solid line. Voltage-current characteristics when the oscillation circuit 100 and the resistor shunt element 301 illustrated in FIG. 12 are regarded as one element are indicated by the dotted line.

In the present embodiment, voltage-current characteristics such that a voltage with which the same current as the current Iop flowing when the voltage Vop is applied in the negative resistance region NR flows is present in the resistance region PR are necessary. However, as exemplified by the relation of a voltage Vid1 and a current Iid1 in the graph in FIG. 13, when the resistor shunt element 301 is used, a voltage with which the same current as a current Iop1 flowing when a voltage Vop1 in the negative resistance region NR is applied is not present in the resistance region PR. Thus, when the resistor shunt element 301 is used, it can be said that voltage-current characteristics such that a voltage with which the same current as the current Iop flowing when the voltage Vop is applied in the negative resistance region NR flows is present in the resistance region PR cannot be obtained. In the voltage-current characteristics when the resistor shunt element 301 is used, even if characteristics near the boundary at which the negative resistance region NR and the resistance region PR are switched are used, stable terahertz oscillation is difficult to perform. On the other hand, when the capacitor shunt element 302 is used, voltage-current characteristics in which a voltage Vid2 with which the same current Iid2 as a current Iop2 flowing when a voltage Vop2 is applied in the negative resistance region NR flows is present in the resistance region PR can be obtained. Similar voltage-current characteristics can be obtained also when the resistor capacitor shunt element 310 is used.

Consequently, the oscillation circuit 100 in the oscillator 2 or 20 in the present embodiment can suppress parasitic oscillation by the capacitor shunt element 302 or the resistor capacitor shunt element 310, and perform oscillation operation at a stable bias point.

Third Embodiment

Figure 6A:
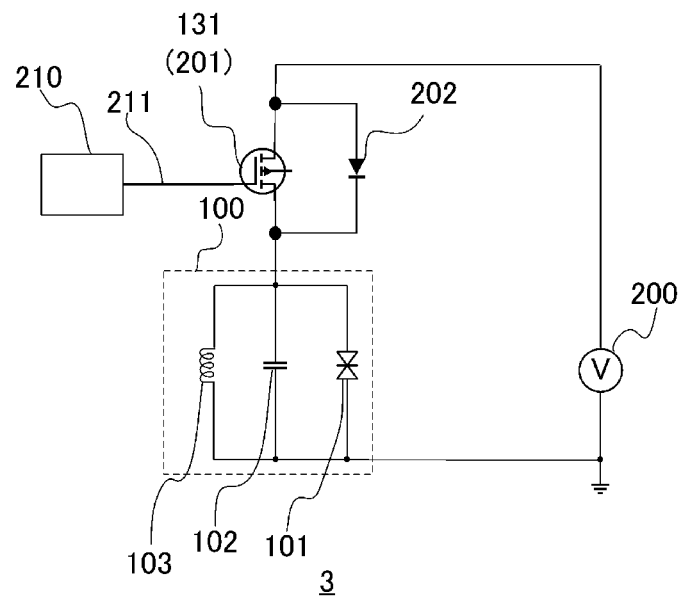
FIGS. 6A and 6B are schematic diagrams for describing oscillators according to a third embodiment.
Figure 6B:
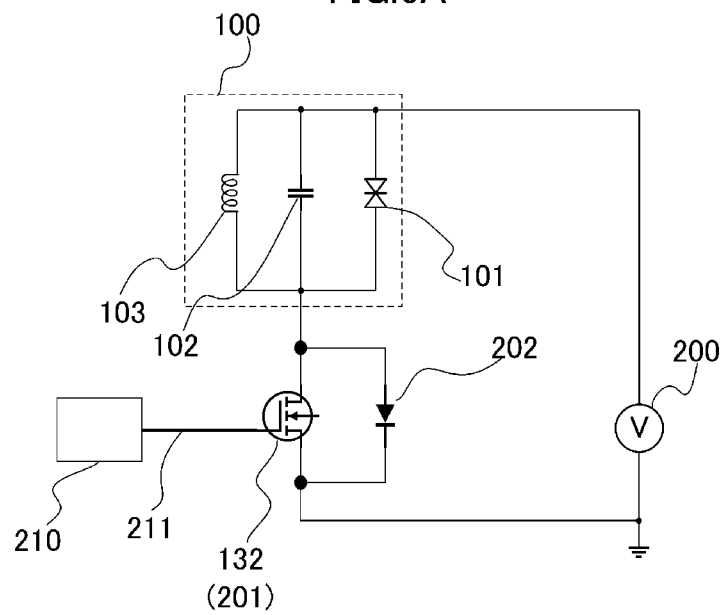

Next, an oscillator in a third embodiment is described. Note that, in the following description, the same components as in the first embodiment or the second embodiment are denoted by the same reference symbols, and detailed descriptions thereof are omitted. FIG. 6A illustrates a schematic configuration of an oscillator 3 according to the present embodiment. FIG. 6B illustrates a schematic configuration of another oscillator 30 according to the present embodiment. The oscillator 3 in FIG. 6A includes a P-type MOSFET (hereinafter referred to as "PMOS") 131. The oscillator 30 in FIG. 6B includes an N-type MOSFET (hereinafter referred to as "NMOS") 132.

Figure 7A:
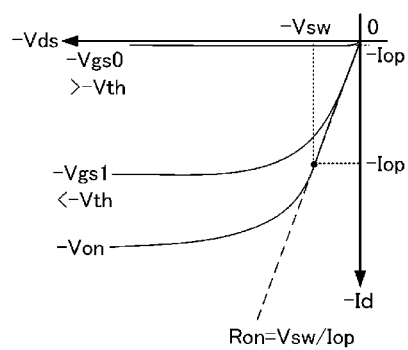
FIGS. 7A to 7D are other schematic diagrams for describing the oscillators according to the third embodiment.
Figure 7B:
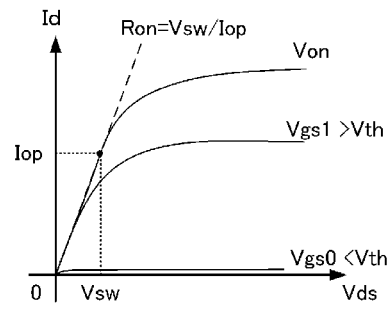
Figure 7C:
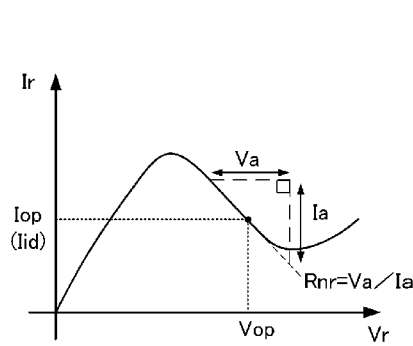
Figure 7D:
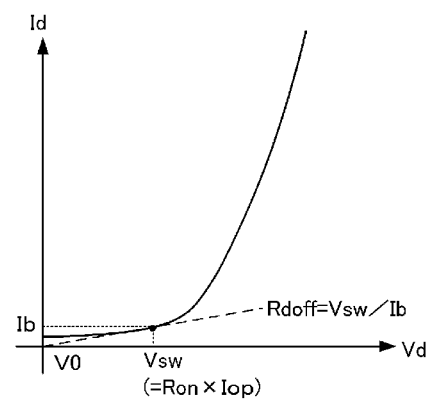

FIG. 7A illustrates an example of voltage-current characteristics of the PMOS 131. In FIG. 7A, curves represent difference in voltage Vgs applied to a gate. FIG. 7C illustrates an example of voltage-current characteristics of the negative resistance element 101 included in the oscillation circuit 100. FIG. 7D illustrates an example of voltage-current characteristics of a diode 202.

The PMOS 131 can change between the conductive state and the non-conductive state depending on the voltage Vgs applied to the gate, more exactly, a potential difference with a source voltage. When a voltage Vgs (=−Von<−Vth (Vth: threshold voltage of MOS)) is applied to the PMOS 131, the PMOS 131 becomes the conductive state. When a voltage Vgs (=0>−Vth) is applied to the PMOS 131, the PMOS 131 becomes the non-conductive state. Even when the PMOS 131 is in the conductive state, the PMOS 131 has a resistor in a strict sense, and this resistor is referred to as "on resistance Ron". When the current Iop flows through the PMOS 131 having the on resistance Ron, a voltage drop (voltage drop amount Vsw=Ron×Iop) occurs in the PMOS 131. Thus, when the on resistance Ron is large, the deviation of the voltage Vr applied to the oscillation circuit 100 from the output voltage Vb of the voltage bias circuit increases. Thus, desirably, the on resistance Ron may be as small as possible. Regarding the negative resistance element 101 having the oscillation circuit 100, the inclination (Va/Ia; see FIG. 7C) of the tangent at the operation voltage Vop in the graph of the voltage-current characteristics is referred to as "resistor Rnr". A specific desired value of the on resistance Ron is 1/10 or less, more preferably 1/100 or less, of the resistor Rnr of the negative resistance element 101 in the oscillation circuit 100 (Ron<Rnr). To reduce the on resistance Ron, it is desired to increase the voltage Von without causing no practical problem. It is desired to select a PMOS 131 with a small on resistance Ron in consideration of specifications such as switching time.

Further, when the voltage drop amount Vsw in the PMOS 131 increases, the voltage Vd between the terminals of the diode 202 also increases, and hence the current Id flowing through the diode 202 increases. Thus, when the voltage drop amount Vsw becomes too large, the diode 202 starts to be conductive, and the voltage drop in the diode 202 becomes dominant. As a result, when the switch 201 is set to the non-conductive state, the voltage Vr across the oscillation circuit 100 does not sufficiently decrease, and terahertz oscillation cannot be completely stopped. To avoid this situation, the voltage drop amount Vsw needs to fall within a range sufficiently smaller than the threshold voltage Vth of the diode 202. Specifically, the voltage drop amount Vsw is desirably 0.5 V or less.

The above is translated with another parameter as follows. The inclination (Vsw/Ib; see FIG. 7D) of the tangent when the voltage Vsw is applied to the diode 202 in the graph of the voltage-current characteristics is represented by "resistance Rdoff". Note that a current Ib is a current flowing through the diode 202. The resistance Rdoff with respect to a voltage Ron×Iop between the terminals of the diode 202 needs to be sufficiently smaller than the on resistance Ron of the PMOS 131. Desirably, the resistance with respect to the voltage Ron×Iop between the terminals of the diode 202 is preferably 1/10 or less, more preferably 1/100 or less, of the on resistance Ron of the PMOS 131 (Rdoff<Ron).

As described above, in the oscillator 3 according to the present embodiment, the switch 201 is configured by the PMOS 131, and hence the voltage applied to the oscillation circuit 100 can be stabilized with a simple configuration.

A configuration of another oscillator 30 than the oscillator 3 in the present embodiment is described with reference to FIG. 6B and FIG. 7B. In the oscillator 30 illustrated in FIG. 6B, an NMOS 132 is used as the switch 201. FIG. 7B illustrates an example of voltage-current characteristics of the NMOS 132.

Similarly to the PMOS 131, the NMOS 132 can change between the conductive state and the non-conductive state depending on a voltage Vgs applied to a gate, more exactly, a potential difference from a source voltage. When a voltage Vgs (=Von>Vth) is applied to the NMOS 132, the NMOS 132 becomes the conductive state. Compared with the use of the PMOS 131, the NMOS 132 has a shorter switching time for switching characteristics between the conductive and non-conductive state, and hence can change the voltage even faster. Consequently, the oscillator 30 having such a configuration can further stabilize the voltage applied to the oscillation circuit 100.

Fourth Embodiment

Figure 8A:
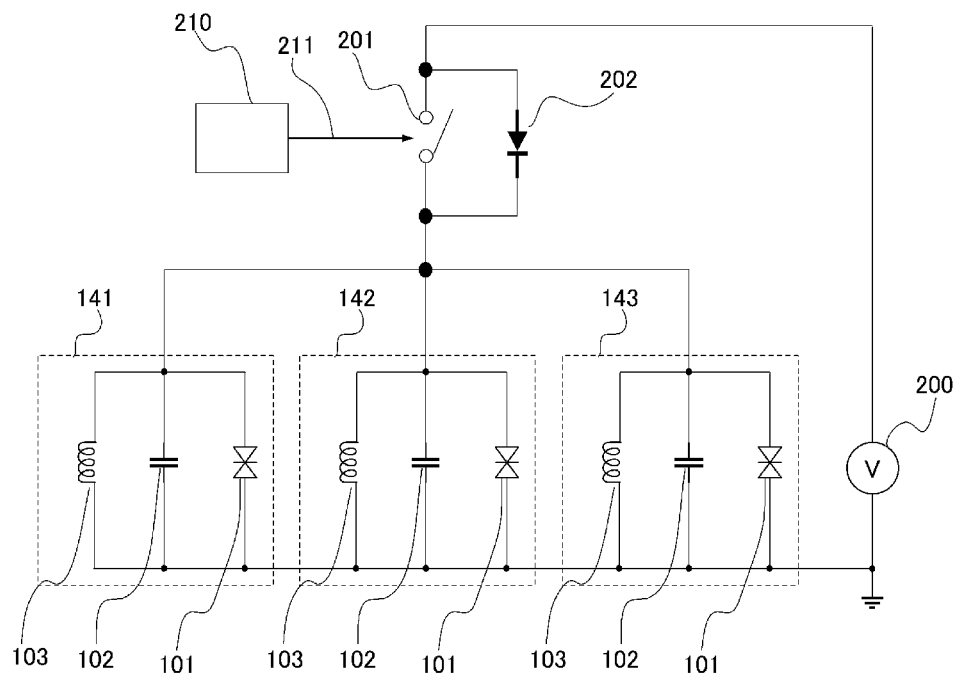
FIGS. 8A and 8B are schematic diagrams for describing an oscillator according to a fourth embodiment.

Next, an oscillator in a fourth embodiment is described. Note that, in the following description, the same components as in the first to third embodiments are denoted by the same reference symbols, and detailed descriptions thereof are omitted. FIG. 8A illustrates a schematic configuration of an oscillator 4 according to the fourth embodiment. As illustrated in FIG. 8A, the oscillator 4 has a first oscillation circuit 141, a second oscillation circuit 142, and a third oscillation circuit 143.

Figure 8B:
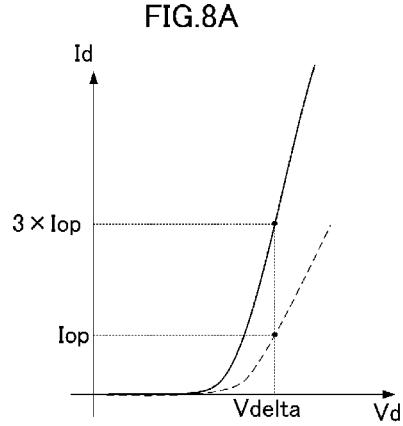

In the present embodiment, a pair of the switch 201 and the diode 202 are coupled in series to the oscillation circuit to which the first oscillation circuit 141, the second oscillation circuit 142, and the third oscillation circuit 143 are coupled in parallel. In the present embodiment, the total of currents flowing through the three oscillation circuits 141, 142, and 143 is three times (3×Iop) the current flowing through the oscillation circuit 101 in the first embodiment. In this manner, the current flowing through the switch 201 or the diode 202 is also three times (3×Iop) the current flowing through the switch 201 or the diode 202 in the first embodiment. Thus, as illustrated in FIG. 8B, the diode 202 in the present embodiment has voltage-current characteristics in which when the voltage Vdelta is applied as the voltage Vd, the flowing current Id becomes 3×Iop. In FIG. 8B, voltage-current characteristics of the diode used in the first to third embodiments are exemplified by the dotted line. As understood from FIG. 8B, when the parameters of the negative resistance element 101 in the oscillation circuit are the same, it is preferred to select a diode with which when N (N is an integer of 2 or more) oscillation circuits are coupled, the current Id flowing with the same voltage Vd (=Vdelta) becomes N times (N×Iop).

In the oscillator 4 according to the present embodiment, even when a plurality of oscillation circuits are coupled, the flowing current hardly changes, and hence the oscillation of the plurality of oscillation circuits 100 can be stably performed to increase terahertz output.

Note that the configuration in which three oscillation circuits are coupled to one switch has been exemplified in the present embodiment, but the configuration of the oscillator 4 is not limited thereto. In other words, in the oscillator 4, the configurations in the above-mentioned embodiments may be combined to use two or more, freely selected number of oscillation circuits as long as the configuration satisfies the above-mentioned parameter requirements.

Fifth Embodiment

Figure 9A:
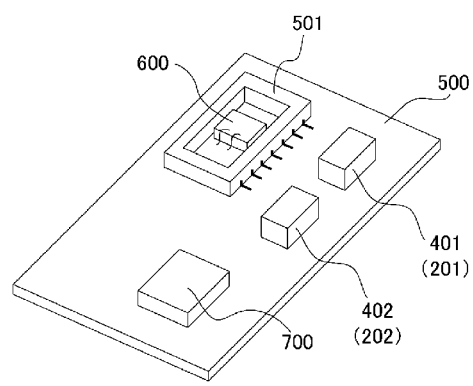
FIGS. 9A to 9C are schematic diagrams for describing an oscillator according to a fifth embodiment.
Figure 9B:
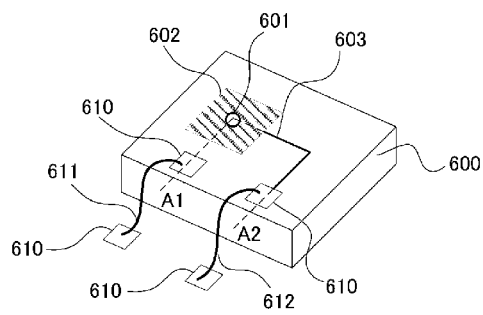
Figure 9C:
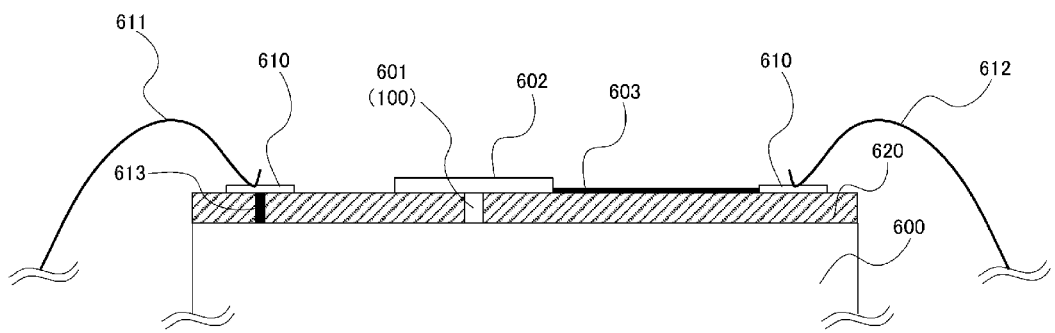

Next, an oscillator in a fifth embodiment is described. Note that, in the following description, the same components as in the first to fourth embodiments are denoted by the same reference symbols, and detailed descriptions thereof are omitted. FIG. 9A illustrates a schematic configuration of an oscillator 5 according to the fifth embodiment. As illustrated in FIG. 9A, the oscillator 5 has a switch 401, a diode 402, a printed circuit board (PCB) 500, a package (PKG) 501, a chip 600, and a voltage bias circuit 700. As illustrated in FIG. 9B and FIG. 9C, the chip 600 is provided with an oscillation circuit 601, an antenna 602, wiring 603 on the chip, a wire bonding electrode 610, a first wire 611, and a second wire 612. Note that FIG. 9C is a diagram illustrating a cross section taken along the line A1-A2 in FIG. 9B.

The chip 600 has an oscillation circuit 601 (100) including RTD, and is mounted in the package 501. As illustrated in FIG. 9B, wiring of the chip 600 is electrically coupled to wiring of the package 501 by wire bonding. As illustrated in FIG. 9A, the package 501, the voltage bias circuit 700 (200), and the surface-mounted (SMD) type-switch 401 and diode 402 in the form of packaged are mounted on the printed circuit board 500. The voltage bias circuit 700 is coupled to the oscillation circuit 601 in the chip 600 through the switch 401 and the diode 402 coupled in parallel. Note that the voltage bias circuit 700 and the oscillation circuit 601 are coupled by wiring of the printed circuit board 500 and the package 501, but the illustration thereof is omitted. A DC voltage Vb is applied from the voltage bias circuit 700 to wiring coupled to the switch 401 and the diode 402 coupled in parallel. Note that the size of the chip 600 is typically 1 mm squire to several mm square, but a larger size (10 mm square) may be employed.

As illustrated in FIG. 9C, an insulating film 620 is disposed on the chip 600. The oscillation circuit 601 is disposed on the chip 600 in a depth direction of the insulating film 620, and one terminal of the oscillation circuit 601 is coupled to the chip 600 (substrate potential of chip 600). The other terminal of the oscillation circuit 601 is coupled to the antenna 602 disposed on the oscillator 600, and the antenna 602 is coupled to a wire bonding electrode 610 through the wiring 603 on the chip 600. The chip 600 is coupled to another wire bonding electrode 610 through the wiring 613 passing through the insulating film 620. The size of the antenna 602 may be determined based on an oscillation frequency of terahertz waves, and is, for example, 100 μm square to several hundreds of μm square. Depending on the oscillation frequency, an antenna with a larger size (several mm square) may be used. The shape of the antenna 602 in the oscillator 5 is not limited to the square shape, and any shape may be employed as long as terahertz oscillation can be performed.

In the present embodiment, the switch 401 (201) and the diode 402 (202) are configured as surface-mounted parts, and hence elements of necessary characteristics can be freely selected and used. Depending on fluctuation in parameters defining the characteristics of the negative resistance element 101 in the oscillation circuit 601, the switch 401 (201) and the diode 402 (202) having optimum characteristics can be used. Thus, the optimum elements 401 and 402 can be easily determined, and hence the voltage applied to the oscillation circuit 601 can be further stabilized.

The use of surface-mounted parts can obtain an effect that the degree of integration can be increased while suppressing the mounting area. Note that the configuration in which the chip is disposed on the package has been described in the present embodiment, but the configuration that can be employed for the oscillator 5 is not limited thereto. A configuration in which the chip 600 is directly disposed on the printed circuit board 500 can be employed. In this case, the package 501 can be omitted, and hence the oscillator 5 can be configured by a smaller number of components.

Sixth Embodiment

Figure 10A:
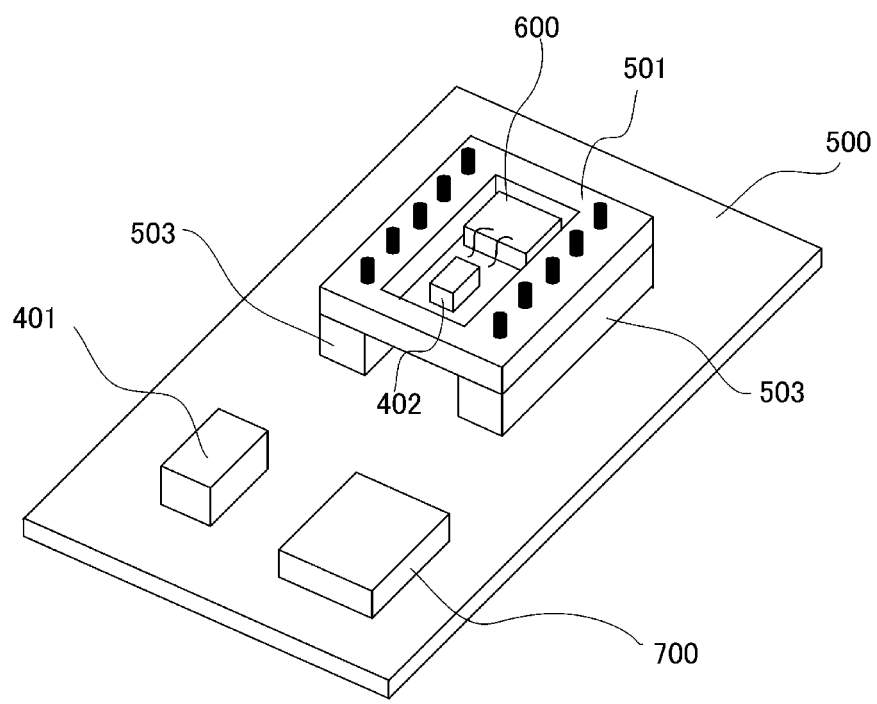
FIGS. 10A and 10B are schematic diagrams for describing an oscillator according to a sixth embodiment.

Next, an oscillator in a sixth embodiment is described. Note that, in the following description, the same components as in the first to fifth embodiments are denoted by the same reference symbols, and detailed descriptions thereof are omitted. FIG. 10A illustrates a schematic configuration of an oscillator 6 according to the sixth embodiment. As illustrated in FIG. 10A, the oscillator 6 has a switch 401, a diode 402, a printed circuit board 500, a package 501, pins 502, pin sockets 503, a chip 600, and a voltage bias circuit 700.

Figure 10B:
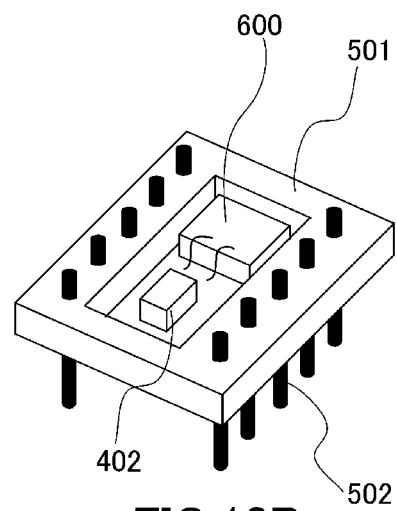

As illustrated in FIG. 10B, in the present embodiment, the diode 402 is provided on the package 501, and the package 501 can be inserted and removed to and from the printed circuit board 500. The package 501 has the pins 502, and the printed circuit board 500 has the pin sockets 503 corresponding to the pins 502. In this manner, the package 501 having the chip 600 can be inserted and removed to and from the printed circuit board 500. Even when the oscillator 6 is replaced with another oscillator having different characteristics or when the oscillator 6 has failed and is replaced with a new oscillator, the oscillator can be replaced for each package 501.

The diode 402 is mounted on the same package 501 as the chip 600. In this manner, when the characteristics of the oscillation circuit 100 vary depending on chips, the configuration with a smaller current fluctuation can be implemented by changing the characteristics of the diode 402. In the present embodiment, the diode 402 is provided on the package 501 in which the chip 600 including the oscillation circuit 100 is mounted, and hence when the package 501 is replaced, the diode 402 can be replaced together. In this manner, even when the package is replaced with a package 501 having an oscillation circuit 100 having different characteristics, the diode 402 is also replaced with a diode suited for the characteristics of the oscillation circuit 100, and hence the voltage applied to the oscillation circuit 100 can be stabilized.

On the other hand, the switch 401 is mounted on the printed circuit board 500 separately from the package 501. Even when the characteristics of the oscillation circuit 100 vary depending on chips, the switch 401 does not greatly affect the characteristics as compared with the diode 402, and hence the advantage to replace the switch 401 is considered to be low in the improvement of the characteristics. For this reason, the switch 401 is not mounted on the package 501. In this manner, the area of parts mounted on the package 501 can be minimized, and the package can be downsized and the number of components in the package can be reduced. The oscillator 6 can downsize the package and facilitate the replacement, and can thus stabilize the voltage applied to the oscillation circuit 100.

Note that the configuration in which only the diode 402 is disposed on the package 501 has been exemplified in the present embodiment, but the configuration of the oscillator 6 is not limited thereto. For example, a configuration in which the switch 401 and the diode 402 are disposed on the package 501 can be employed for the oscillator 6. In this case, the mounting area of the printed circuit board 500 can be further reduced. The configuration in which surface-mounted parts are used as the switch 401 and the diode 402 has been exemplified, but a chip in which the switch 401 and the diode 402 are formed may be used. In this case, the mounting areas of the switch 401 and the diode 402 can be further reduced. A configuration in which the switch 401 and the diode 402 are integrated on the chip 600 in which the oscillation circuit 100 is formed may be employed. In this case, the mounting areas of the switch 401 and the diode 402 can be further reduced.

Seventh Embodiment

Figure 11:
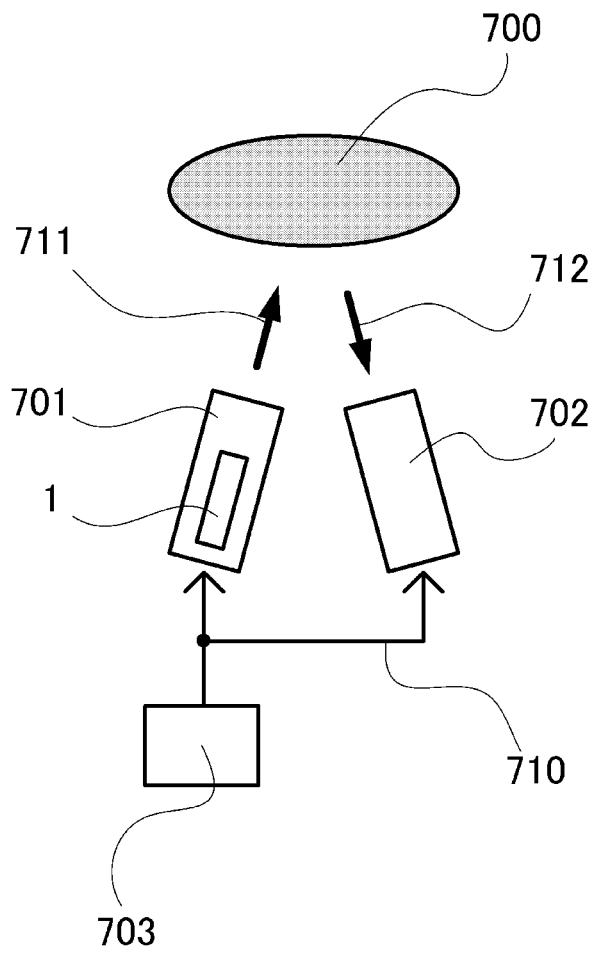
FIG. 11 is a schematic diagram for describing an oscillator according to a seventh embodiment.

Next, an imaging device including an oscillator in a seventh embodiment is described. Note that, in the following description, the same components as in the first to sixth embodiments are denoted by the same reference symbols, and detailed descriptions thereof are omitted. FIG. 11 schematically illustrates an imaging device 70 in the seventh embodiment. As illustrated in FIG. 11, the imaging device 70 includes an illumination device 701, an imaging element 702, and a timing generation unit 703. The illumination device 701 includes the oscillator 1 according to the first embodiment. The illumination device 701 irradiates a subject 700 with terahertz waves 711 (predetermined electromagnetic waves). The imaging element 702 acquires (images) the terahertz waves 712 reflected by the subject 700. The imaging element 702 can acquire image information on the subject 700 that changes correspondingly to the shape and physical values of the subject 700.

The timing generation unit 703 inputs a timing signal 710 to the illumination device 701 and the imaging element 702. The illumination device 701 adjusts the timing to switch the conductive state and the non-conductive state of the switch 201 in the oscillator 1 based on the input timing signal 710. The illumination device 701 periodically repeats the terahertz oscillation and the stop of the oscillation at the adjusted timing, with the result that there is a period during which the subject 700 is irradiated with terahertz waves and a period during which the subject 700 is not irradiated with terahertz waves. On the other hand, the imaging element 702 images the subject 700 based on the input timing signal 710 in the period during which the illumination device 701 applies terahertz waves and the period during which the illumination device 701 does not apply terahertz waves. The imaging element 702 determines difference in information imaged in the two periods. Due to the difference, the imaging element 702 can remove components (noise components) of electromagnetic waves that are undesirably applied to the subject 700. As a result, the SN ratio (Signal to Noise Ratio) of image information on the subject 700 can be improved.

Thus, the imaging device in the present embodiment can stably perform periodical repetition of the oscillation of terahertz waves and the stop of the oscillation, and hence can be used as a terahertz imaging device capable of acquiring image information having a high SN ratio.

According to the technology disclosed herein, a technology for stably performing oscillation in an oscillator including a negative resistance element and a resonance circuit can be provided.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-153639, filed on Aug. 26, 2019, which is hereby incorporated by reference herein in its entirety.

What is claimed is:
1. An oscillator comprising:
an oscillation circuit including a negative resistance element;
a voltage bias circuit applying voltage to the oscillation circuit;
a switch provided in a path in which the voltage bias circuit and the oscillation circuit are electrically coupled to each other, the switch implementing switching between a conductive state and a non-conductive state of the path; and
a constant voltage element electrically coupled in parallel to the switch,
wherein the negative resistance element and the switch are connected in series.

2. The oscillator according to claim 1, wherein an anode terminal and a cathode terminal of the constant voltage element are arranged in this order in a direction in which current flows into the oscillation circuit.

3. The oscillator according to claim 1, wherein the oscillation circuit performs oscillation when the path is brought into a conductive state by the switch, and the oscillation circuit stops the oscillation when the path is brought into a non-conductive state by the switch.

4. The oscillator according to claim 1, wherein a current flowing through the oscillation circuit when the path is brought into a conductive state by the switch and a current flowing through the oscillation circuit when the path is brought into a non-conductive state by the switch are substantially the same.

5. The oscillator according to claim 1, wherein a voltage value of a voltage applied to the oscillation circuit when the path is brought into a conductive state by the switch is within a range of a negative resistance region in voltage-current characteristics of the negative resistance element, and wherein a voltage value of a voltage applied to the oscillation circuit when the path is brought into a non-conductive state by the switch is outside the range of the negative resistance region.

6. The oscillator according to claim 1, wherein the negative resistance element has voltage-current characteristics in which a current value of a current flowing when a voltage having a voltage value of an upper limit of a negative resistance region is applied is smaller than a current value of a current flowing when a voltage having a voltage value of a lower limit of the negative resistance region is applied.

7. The oscillator according to claim 1, wherein, when a voltage applied to the negative resistance element in a case where a first current flows through the oscillation circuit during oscillation of the oscillation circuit is a first voltage, and when a voltage applied to the negative resistance element in a case where a second current flows through the oscillation circuit during stop of the oscillation of the oscillation circuit is a second voltage, and moreover when a voltage applied to the constant voltage element in a case where a third current flows through the constant voltage element during the stop of the oscillation of the oscillation circuit is a third voltage:

a voltage value of the first voltage is within a range of a negative resistance region in voltage-current characteristics of the negative resistance element, a voltage value of the second voltage is outside the range of the negative resistance region, current values of the first current, the second current, and the third currents are substantially equal to one another, and a difference between the voltage value of the first voltage and the voltage value of the second voltage is substantially equal to a voltage value of the third voltage.

8. The oscillator according to claim 1, further comprising a capacitor coupled in parallel to the oscillation circuit.

9. The oscillator according to claim 8, further comprising a resistor coupled in series to the capacitor, wherein the capacitor and the resistor are coupled in parallel to the oscillation circuit.

10. The oscillator according to claim 1, wherein the switch is a P-type MOSFET or an N-type MOSFET.

11. The oscillator according to claim 1, wherein a plurality of the oscillation circuits are coupled to a pair made up of the switch and the constant voltage element.

12. The oscillator according to claim 1, wherein the constant voltage element is provided on a package in which the oscillation circuit is mounted or on a chip of the oscillation circuit.

13. The oscillator according to claim 1, wherein a frequency of electromagnetic waves oscillated by the oscillation circuit is 30 GHz or more and 30 THz or less.

14. An illumination device comprising an oscillator, the oscillator including:

an oscillation circuit including a negative resistance element;

a voltage bias circuit applying a voltage to the oscillation circuit;

a switch provided in a path in which the voltage bias circuit and the oscillation circuit are electrically coupled to each other, the switch implementing switching between a conductive state and a non-conductive state of the path; and a constant voltage element electrically coupled in parallel to the switch, wherein the negative resistance element and the switch are connected in series.

15. An imaging device, comprising:

the illumination device according to claim 14; and an imaging element imaging a subject irradiated with electromagnetic waves oscillated by the oscillator.

* * * * *